(12) United States Patent
Camillo-Castillo et al.

(10) Patent No.: US 8,603,889 B2
(45) Date of Patent: Dec. 10, 2013

(54) INTEGRATED CIRCUIT STRUCTURE HAVING AIR-GAP TRENCH ISOLATION AND RELATED DESIGN STRUCTURE

(75) Inventors: Renata A. Camillo-Castillo, Essex Junction, VT (US); James S. Dunn, Jericho, VT (US); David L. Harame, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 68 days.

(21) Appl. No.: 13/436,045

(22) Filed: Mar. 30, 2012

(65) Prior Publication Data

US 2013/0256758 A1  Oct. 3, 2013

(51) Int. Cl.
*H01L 21/78* (2006.01)
(52) U.S. Cl.
USPC ........... 438/411; 438/400; 438/421; 438/422; 438/424
(58) Field of Classification Search
USPC .......................... 438/400, 411, 421, 422, 424
See application file for complete search history.

(56) References Cited

U.S. PATENT DOCUMENTS

| | | |
|---|---|---|
| 6,071,805 A | 6/2000 | Liu |
| 6,835,631 B1 | 12/2004 | Zhen et al. |
| 6,964,907 B1 | 11/2005 | Hopper et al. |
| 7,037,851 B2 | 5/2006 | Gueneau de Mussy et al. |
| 7,211,496 B1 | 5/2007 | Natzle |
| 7,276,425 B2 | 10/2007 | Averett et al. |
| 7,319,274 B2 | 1/2008 | Beyer et al. |
| 7,400,024 B2 | 7/2008 | Kunnen |
| 7,482,999 B2 | 1/2009 | Homma et al. |
| 7,585,744 B2 | 9/2009 | Gogoi et al. |
| 7,629,657 B2 | 12/2009 | Partridge et al. |
| 7,811,924 B2 | 10/2010 | Cui et al. |

*Primary Examiner* — Thanh V Pham
(74) *Attorney, Agent, or Firm* — Anthony J. Canale; Hoffman Warnick LLC (57) ABSTRACT

A method of forming an integrated circuit structure includes: forming a vent via extending through a shallow trench isolation (STI) and into a substrate; selectively removing an exposed portion of the substrate at a bottom of the vent via to form an opening within the substrate, wherein the opening within the substrate abuts at least one of a bottom surface or a sidewall of the STI; and sealing the vent via to form an air gap in the opening within the substrate.

9 Claims, 12 Drawing Sheets

FIG. 12 ated circuit structure having an air-gap trench isolation, as well as a related design structure. More specifically, the subject matter disclosed herein relates to integrated circuit structures having air-gap trench isolations, methods of forming such structures, and associated design structures.

BACKGROUND

As integrated circuits continue to reduce in size, implementing effective isolation of working components in these devices becomes more difficult. In the case of transistor structures in particular, design requirements call for effective isolation of working components to reduce negative effects such as parasitic coupling and undesirably high power consumption.

BRIEF SUMMARY

A method of forming an integrated circuit structure is disclosed. The method includes: forming a vent via extending through a shallow trench isolation (STI) and into a substrate; selectively removing an exposed portion of the substrate at a bottom of the vent via to form an opening within the substrate, wherein the opening within the substrate abuts at least one of a bottom surface or a sidewall of the STI; and sealing the vent via to form an air gap in the opening within the substrate.

A first aspect includes a method of forming an integrated circuit structure, the method including: forming a vent via extending through a shallow trench isolation (STI) and into a substrate; selectively removing an exposed portion of the substrate at a bottom of the vent via to form an opening within the substrate, wherein the opening within the substrate abuts at least one of a bottom surface or a sidewall of the STI; and sealing the vent via to form an air gap in the opening within the substrate.

A second aspect includes a transistor structure having: a substrate; a shallow trench isolation (STI) located within the substrate; a base region overlying the STI; a collector region separated from the base region by the substrate; an air gap region within the substrate, the air gap region abutting at least one of a lower surface of the STI or a sidewall of the STI; and a cap layer sealing the air gap region.

A third aspect includes a design structure tangibly embodied in a machine readable medium for design, manufacturing, or testing a semiconductor device, the design structure having: a transistor structure including: a substrate; a shallow trench isolation (STI) located within the substrate; a base region overlying the STI; a collector region separated from the base region by the substrate; an air gap region within the substrate, the air gap region abutting at least one of a lower surface of the STI or a sidewall of the STI; and a cap layer sealing the air gap region.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted herein, the subject matter disclosed relates to an integrated circuit structure having an air-gap trench isolation. More specifically, the subject matter disclosed herein relates to integrated circuit structures having air-gap trench isolations, and methods of forming such structures.

As integrated circuits continue to reduce in size, implementing effective isolation of working components in these devices becomes more difficult. In the case of transistor structures in particular, design requirements call for effective isolation of working components to reduce negative effects such as parasitic coupling and undesirably high power consumption. As noted herein, aspects of the invention provide for methods of forming structures having effective isolation regions, and the structures so formed.

A first aspect includes a method of forming an integrated circuit structure, the method including: forming a vent via extending through a shallow trench isolation (STI) and into a substrate; selectively removing an exposed portion of the substrate at a bottom of the vent via to form an opening within the substrate, wherein the opening within the substrate abuts at least one of a bottom surface or a sidewall of the STI; and sealing the vent via to form an air gap in the opening within the substrate.

A second aspect includes a transistor structure having: a substrate; a shallow trench isolation (STI) located within the substrate; a base region overlying the STI; a collector region separated from the base region by the substrate; an air gap region within the substrate, the air gap region abutting at least one of a lower surface of the STI or a sidewall of the STI; and a cap layer sealing the air gap region.

A third aspect includes a design structure tangibly embodied in a machine readable medium for design, manufacturing, or testing a semiconductor device, the design structure having: a transistor structure including: a substrate; a shallow trench isolation (STI) located within the substrate; a base region overlying the STI; a collector region separated from the base region by the substrate; an air gap region within the substrate, the air gap region abutting at least one of a lower surface of the STI or a sidewall of the STI; and a cap layer sealing the air gap region.

As used herein, the term "deposition" may include any now known or later developed techniques appropriate for the material to be deposited including but are not limited to, for example: chemical vapor deposition (CVD), low-pressure CVD (LPCVD), plasma-enhanced CVD (PECVD), sub-atmosphere CVD (SACVD), high density plasma CVD (HD-PCVD), rapid thermal CVD (RTCVD), ultra-high vacuum CVD (UHVCVD), limited reaction processing CVD (LR-PCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 1:
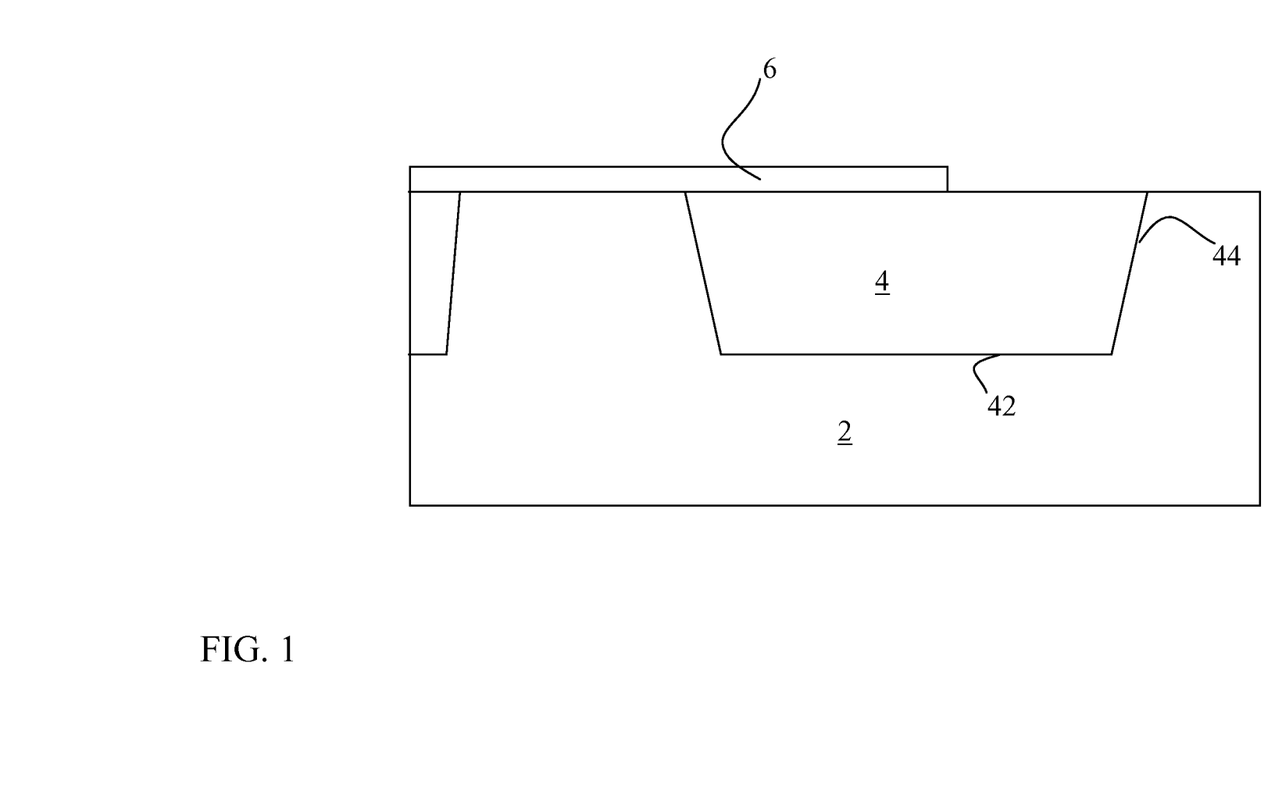
FIG. 1 shows a cross-sectional view of an integrated circuit structure undergoing processing according to various embodiments.

Turning to the drawings, FIG. 1 shows a cross-sectional view of a precursor semiconductor structure according to one embodiment of the invention. The precursor semiconductor structure may include a substrate 2. Substrate 2 may include one or more materials such as silicon, germanium, silicon germanium, silicon carbide, graphene and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. For example, substrate 2 may be strained. In one embodiment, substrate 2 is silicon based. In another embodiment, substrate 2 includes a semiconductor on insulator substrate, e.g. silicon bonded to an insulator such as sapphire, quartz or oxide; or a silicon/silicon dioxide/silicon sandwich.

The precursor integrated circuit structure can further include a shallow trench isolation (STI) 4 located within the substrate 2. The STI 4 can include a lower surface 42, and at least one sidewall 44, which can serve as locations for the air gaps formed according to various embodiments of the invention. The STI 4 can be formed within the substrate 2 according to any conventional methods, e.g., patterning, deposition, epitaxial growth, etc. Overlying the STI 4 and the substrate 2 is a semiconductor layer 6 such as polysilicon, which can be deposited over the STI 4 and the substrate 2 after forming of the STI 4.

Figure 2:
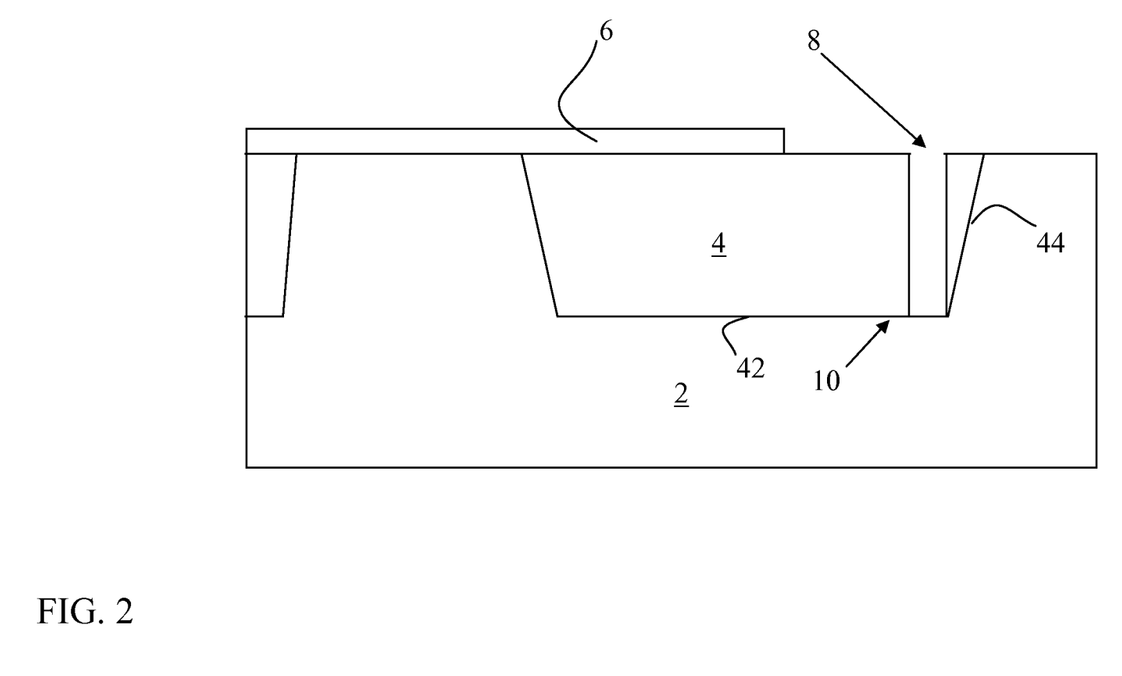
FIG. 2 shows a cross-sectional view of an integrated circuit structure undergoing processing according to various embodiments.

FIG. 2 illustrates a process according to various embodiments of the invention, the process including forming a vent via 8 through the STI 4 and into the underlying substrate 2. In some cases, the vent via 8 can be formed by masking and etching through a portion of the STI 4, e.g., using any conventional masking and etching processes described herein and/or known in the art. In some cases, the etching can be performed using reactive-ion-etching (RIE). The vent via 8 can be formed to contact an upper surface 10 of the substrate 2 below the STI 4, or the vent via 8 can be formed to a location below the upper surface 10.

Figure 3:
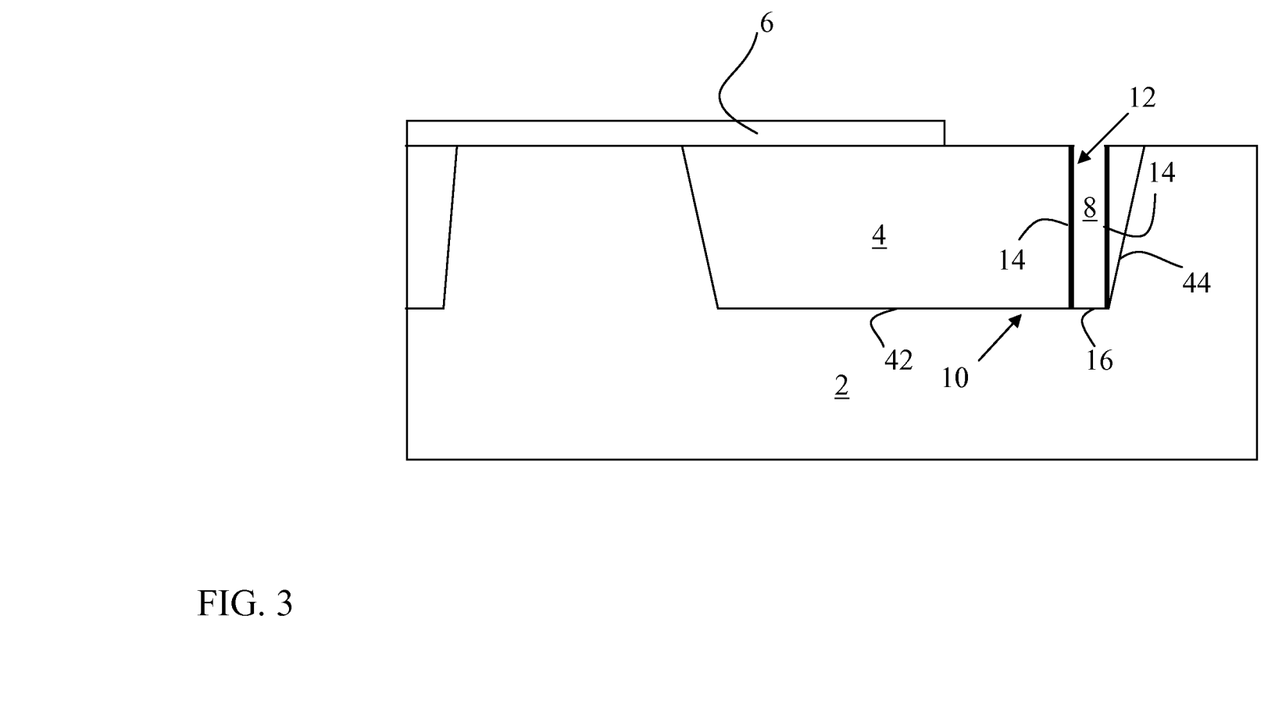
FIG. 3 shows a cross-sectional view of an integrated circuit structure undergoing processing according to various embodiments.

FIG. 3 illustrates another process (an optional process) according to various embodiments of the invention, this optional process including forming a liner 12 along a sidewall 14 of the vent via 8. In some cases, the liner 12 is formed selectively along the sidewalls 14 of the vent via 8 (e.g., via selective deposition techniques described herein and/or known in the art). The liner 12 can be used as an etch stop in subsequent processing steps. Following formation of the liner 12, a portion 16 of the substrate 2 remains exposed at the bottom of the vent via 8.

In various embodiments, the liner layer 12 can be formed of an oxide such as CVD SiO2, and can be selectively deposited along the sidewalls 14 of the vent via 8 using a spacer deposition etch process such that the oxide is removed in the bottom of the vent via 16. The liner layer 12 can be formed as a spacer on the sidewall 14 of the vent via 8, e.g., by depositing a thin layer of oxide on the order of 10-30% of the vent via's 8 width, and plasma etching the oxide back using a directional etch, which removes oxide from the flat surfaces, i.e. the vent via 8 bottom and the planer top layer, but leaves the oxide (liner layer 12) on the vent via 8 sidewalls. In one embodiment, the liner layer 12 can be formed along the sidewalls 14 using at least one deposition technique including atomic layer deposition (ALD), chemical vapor deposition (CVD) or thermal oxide deposition. In another embodiment, a precursor version (seed) of the liner layer 12 can be epitaxially grown within the vent via 8 to form the liner layer 12. Following formation of the liner layer 12, a filler material (e.g., a polysilicon, polygermanium, tungsten, etc.) can be formed via any conventional deposition techniques described herein or known in the art. In some cases, the liner layer 12 can be formed along the lower surface 16 of the vent via 8, however, in other cases, the liner layer 12 can be formed only over the sidewalls 14 of the vent via 8.

Figure 4:
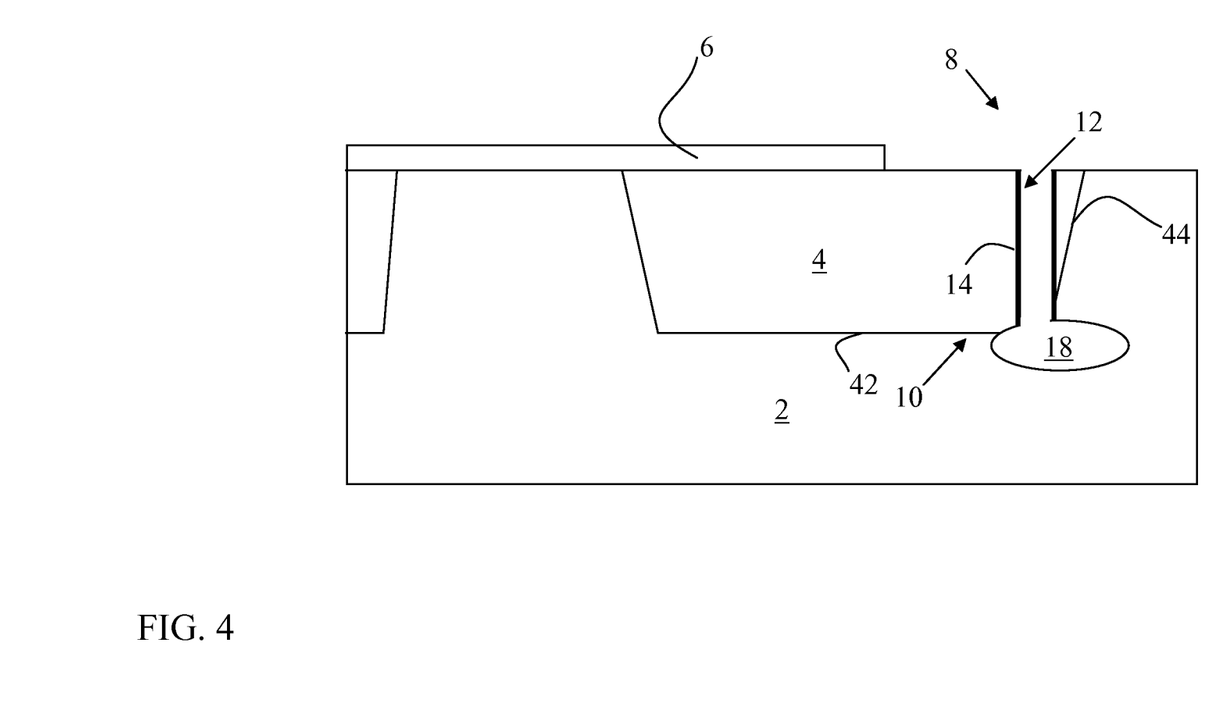
FIG. 4 shows a cross-sectional view of an integrated circuit structure undergoing processing according to various embodiments.

FIG. 4 illustrates another process according to various embodiments of the invention, the process including selectively removing the exposed portion 16 (FIG. 3) of the substrate 2 at the bottom of the vent via 8, forming an opening 18 within the substrate 2. The substrate 2 can be selectively removed using one or more selective etching techniques known in the art and/or described herein. For example, in some embodiments, the substrate 2 can be selectively removed using a RIE process.

Figure 5:
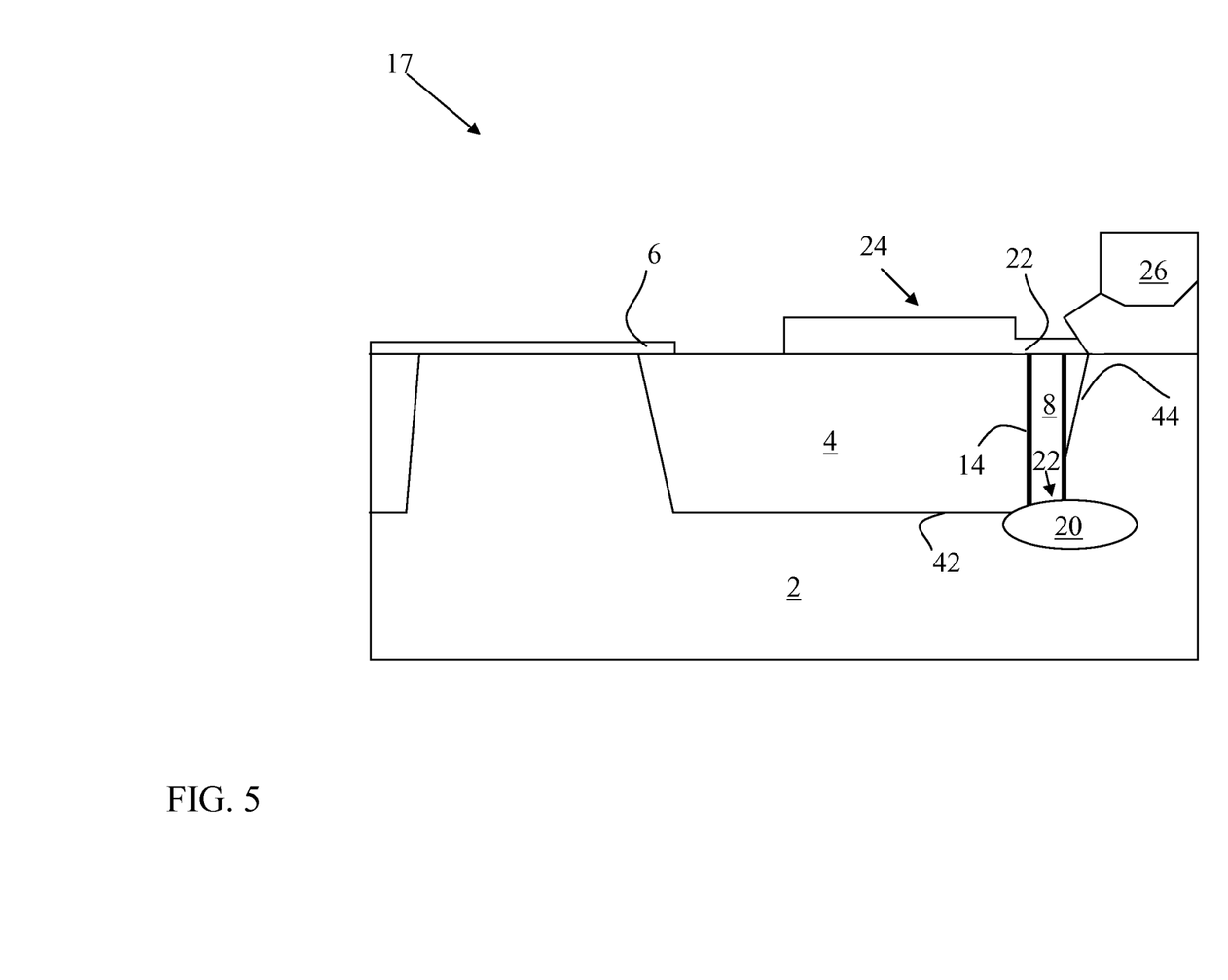
FIG. 5 shows a cross-sectional view of an integrated circuit structure according to various embodiments.

FIG. 5 shows a transistor structure 17, formed after the conclusion of additional processes according to various embodiments of the invention. One of these processes includes sealing the vent via 8 to from an air gap 20 in the opening 18 within the substrate 2. The vent via 8 can be sealed by depositing a cap layer 22 over the vent via 8. In some cases, the cap layer 22 can include: a) a layer of silicon dioxide (SiO2), phosphosilicate glass (PSG), borophosphosilicate glass (BSPG), etc., and can be formed as a single layer or as multiple layers to pinch off the vent via 8 opening; and b) a layer of silicon nitride (SiN) on top to provide a hermetic seal. However, the cap layer 22 can be formed of any material capable of providing a substantially air-tight seal in the air gap 20 and the vent via 8. It is understood that a silicon nitride layer (not shown) can also be included overlying the STI 4, providing a barrier between the vent via 8 and the area above the surface of the STI 4. In some cases, this silicon nitride layer can be approximately 25-100 nanometers thick, and in one particular embodiment, it can be approximately 50 nanometers thick.

The cap layer 22 can be formed by any conventional deposition method described herein and/or known in the art. In some cases, as shown, the cap layer 22 can be formed at the bottom of the vent via 8 in order to seal the air gap 20 at the bottom of the vent via 8. This may be performed as alternative to forming of the cap layer 22 on the surface of the STI 4 (above the vent via 8), or may be performed in addition to the forming of the cap layer 22 on the surface of the STI 4.

Also shown in FIG. 5, a base region 24 and a emitter region 26 are formed after forming of the cap layer 33. The base region 24 and the emitter region 26 can be formed using conventional processes known in the art. The transistor structure 17 shown in FIG. 5 includes an air gap 20 located within the substrate 2. In some cases, the air gap 20 can be located primarily with the substrate 2, and in some embodiments, the air gap 20 can be located entirely within the substrate 2. In some embodiments the transistor structure 17 is a hetero junction bipolar transistor (HBT) structure.

Figure 6:
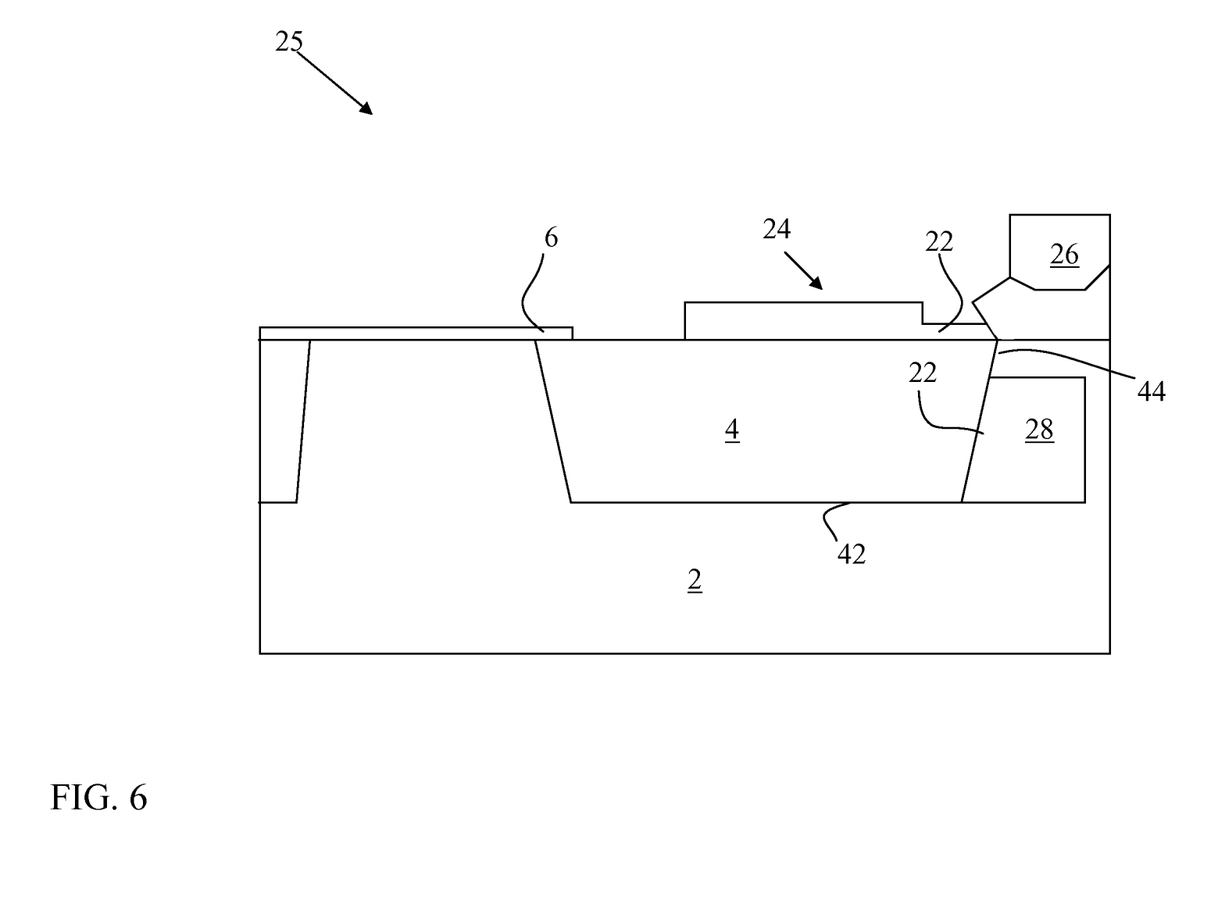
FIG. 6 shows a cross-sectional view of an integrated circuit structure according to various alternative embodiments.

Turning to FIG. 6, an alternative embodiment of an HBT structure 25 is shown according to various embodiments of the invention. In this case, the HBT structure 25 includes an embedded air gap 28 within the substrate 2, where the embedded air gap 28 is located along a sidewall of the STI 4. In this case, the embedded air gap 28 can be formed by increasing the etch time of the substrate 2 and/or shifting the vent via 8 to completely intersect the sidewall of the STI 4.

It is understood that in some cases, the air gap 20 (or embedded air gap 28) can be formed prior to formation of the base 24 and/or emitter 26. However, in other cases, the air gap 20 (or embedded air gap 28 can be formed after formation of the base 24 and emitter 26.

In various other embodiments, as will be described with respect to FIGS. 7-11, one or more air gaps 20 (or embedded air gaps 28 can be formed prior to completion of the STI 4. That is, the air gaps 20 (or 28) can be formed prior to the filling of STI 4.

Figure 7:
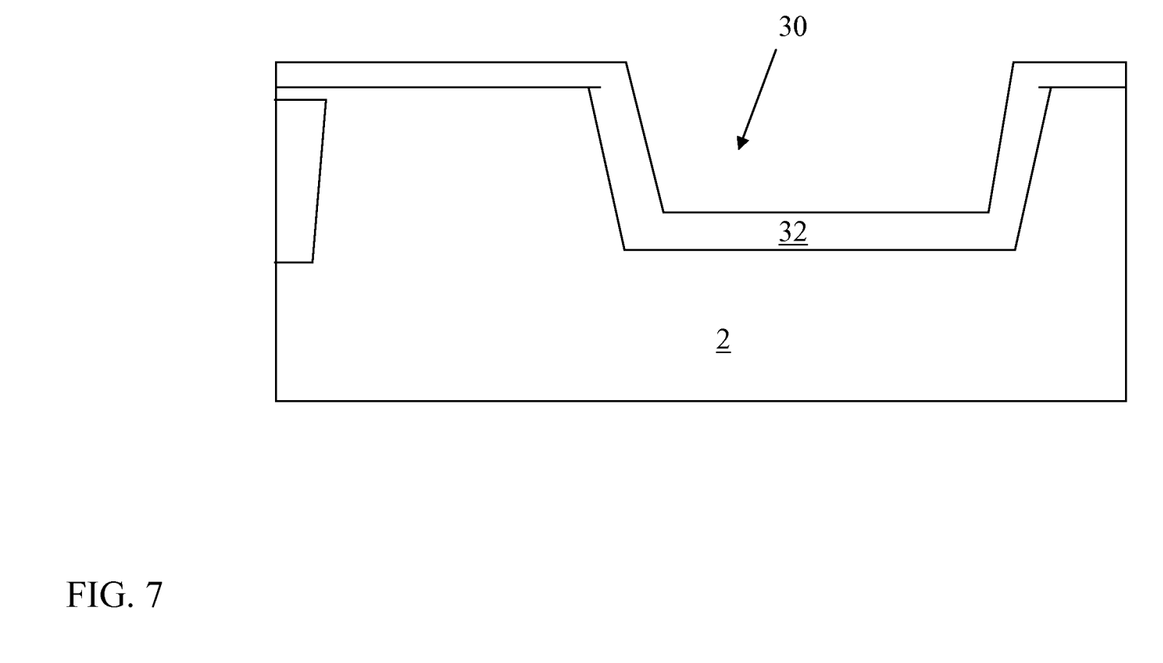
FIGS. 7-11 show cross sectional views of an integrated circuit structure according to various alternative embodiments of the invention.

Turning to FIG. 7, a cross-sectional view of an alternative embodiment of a precursor integrated circuit structure is shown according to various embodiments of the invention. This structure can include a substrate 2 as shown and described in other embodiments herein. Within the substrate 2 is a trench 30, which can be formed as any conventional recess, e.g., via masking and etching of the substrate 2. Over the substrate 2, including the trench 30, a thermal oxidation layer 32 can be formed via low-pressure CVD.

Figure 8:
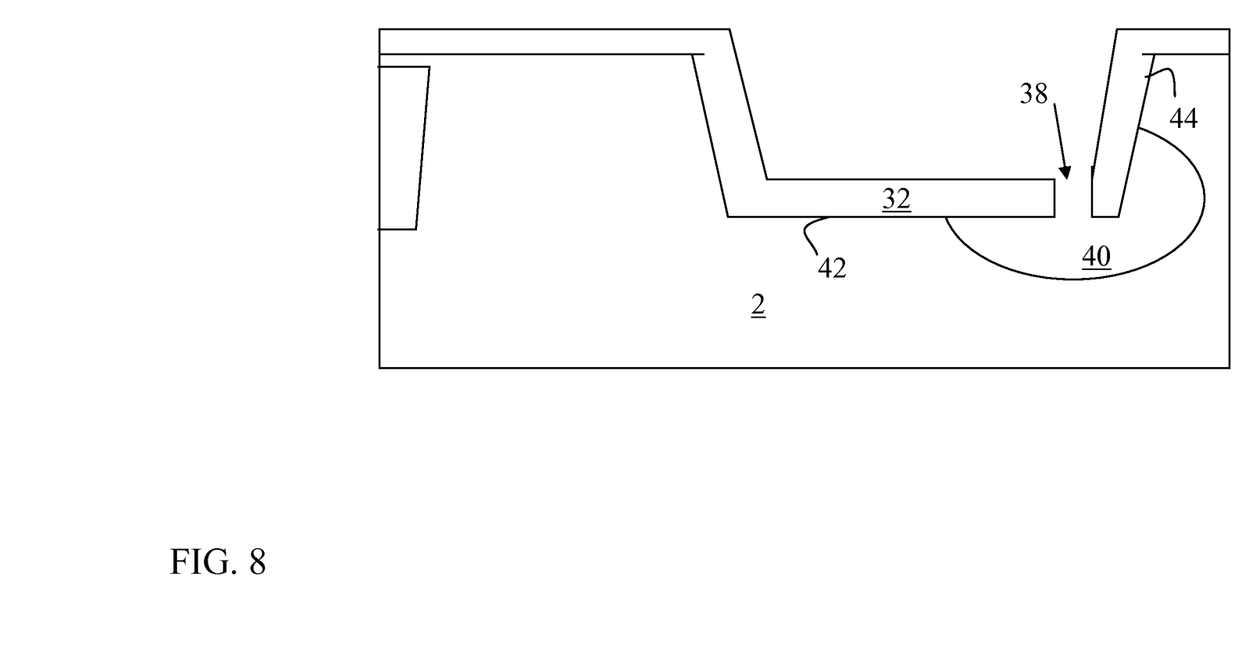

Following formation of the thermal oxidation layer 32, as shown in FIG. 8, a vent via 38 can be formed through the thermal oxidation layer 32 and into the substrate 2. The vent via 38 can be formed via conventional etching techniques, e.g., a selective etching technique.

After opening the vent via 38, as shown in FIG. 8, the process can include continuing to etch into the substrate 2 to form an embedded air gap 40 within the substrate 2. More specifically, the process can include continuing to etch the substrate 2 to form an embedded air gap 40 adjacent to the lower surface 42 and/or sidewall 44 of the trench 30 (which later forms the lower surface and/or sidewall of the STI).

Figure 9:
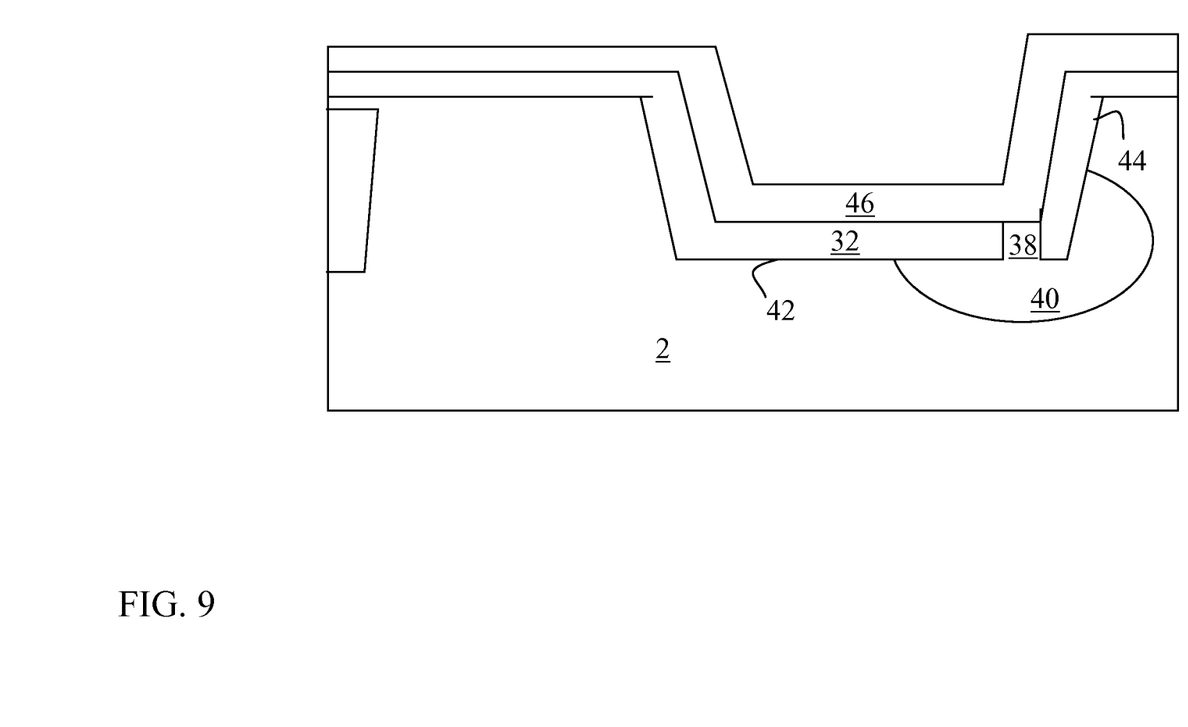

Turning to FIG. 9, another portion of the process can include forming a cap layer (e.g., a dielectric film) 46 over the thermal oxidation layer 32 to substantially seal the vent via 38 and the embedded air gap 40. That is, cap layer (e.g., dielectric film) 46 may provide a substantially air-tight seal over the vent via 38 and the embedded air gap 40 such that a pocket of air remains below the cap layer 46. In various embodiments, the cap layer 46 can be formed over the thermal oxidation layer 32 via chemical vapor deposition (CVD), e.g., a plasma-enhanced CVD process or a selective CVD process.

Figure 10:
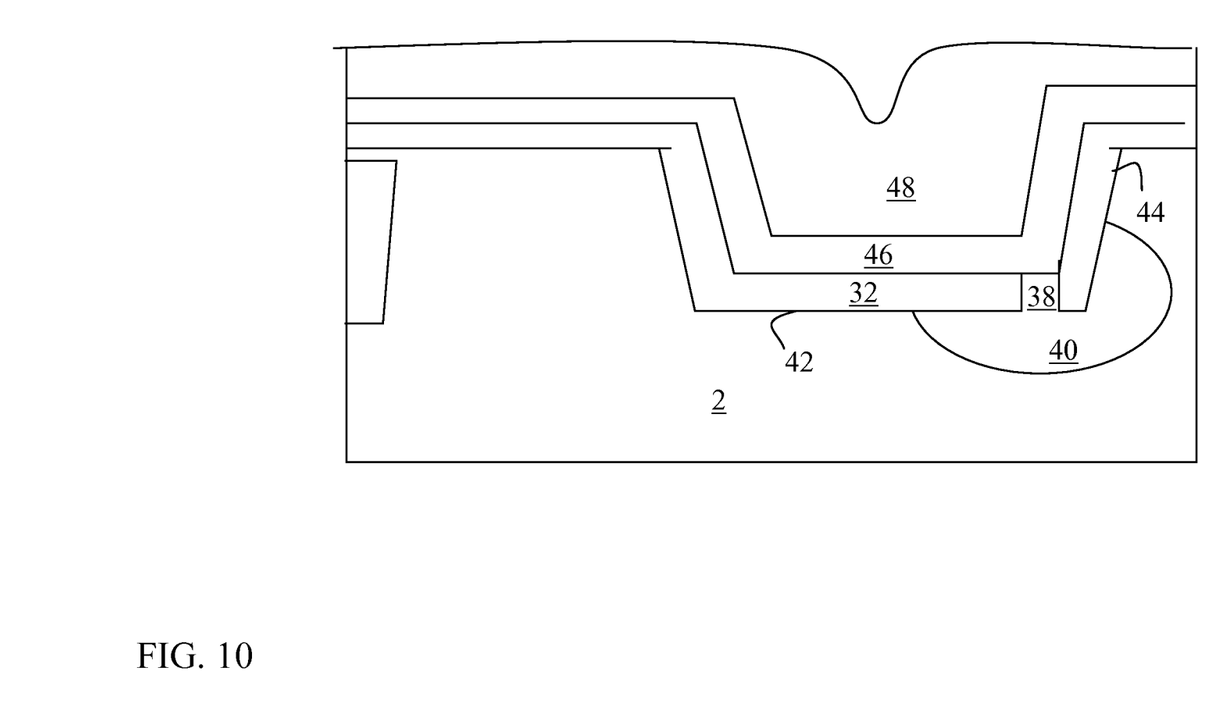

Following formation of the cap layer 46, in FIG. 10, a plasma oxide layer 48 can be formed over the cap layer 46. In some cases, the plasma oxide layer 48 can include a high-density plasma oxide fill, which is deposited directly over the cap layer 46.

Figure 11:
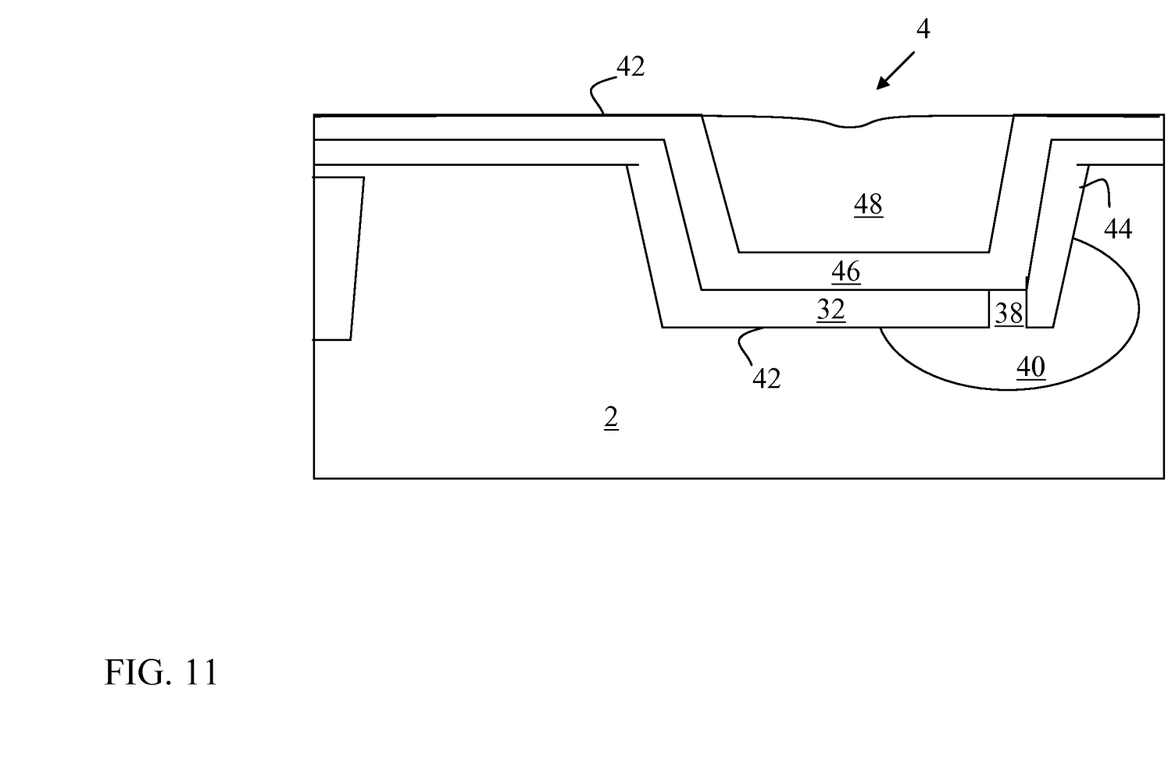

Turning to FIG. 11, following formation of the plasma oxide layer 48, the process can include planarizing that plasma oxide layer 48 to form a substantially planar upper surface 50. Planarizing can be performed according to any conventional techniques, e.g., chemical-mechanical planarization (CMP). It is understood that planarizing of the plasma oxide layer 48 can complete formation of a shallow trench isolation (STI) 4 in the device. It is further understood that the structure of FIG. 11 can be part of a transistor structure (e.g., transistor structure 17 of FIG. 6) including a base region overlying the STI 4, and an emitter region overlying a portion of the substrate 2.

Additionally, the transistor structures 17, 25 can include a group of air gaps 20 (and/or 26) which may be substantially filled with a gas such as air. The air gaps 20, 26 can be located along an outer periphery of an STI 4. In some embodiments, the air gaps 20, 26 can be formed of trenches that are selectively lined with a liner layer (e.g., an oxide). In some cases, the oxide can remain along the sidewalls of the trench after the sealing of the STI 4 (including sealing of a vent via (e.g., vent via 8).

In some embodiments, a group of air gaps 20, 28 and/or 40 can form a substantially continuous perimeter around a portion of an STI 4. In other embodiments, a group of air gaps 20, 26 are positioned in a disjointed arrangement along a portion of a transistor structure. In some embodiments, the air gap 20, 28 and/or 40 can extend approximately 3-13 microns below a lower surface (e.g., lower surface 10) of the substrate 2, and in one particular embodiment, the air gap 20, 28 and/or 40 can extend approximately 8 microns below the surface 10. The air gap 20, 28 and/or 40 can have a width (w) of approximately 0.1 to 0.5 microns, and in one particular embodiment, the air gap 20, 28 and/or 40 can have a width of approximately 0.3 microns. In the case that the transistor structure includes an HBT structure (e.g., HBT transistor structure 17), one or more air gaps 10 can be located between the base region 24 and the emitter region 26.

As shown and described herein, one or more air gaps 20, 28 and/or 40 can include bulbous, rounded or otherwise expanded end portions (e.g., air gap 20) For example, in one embodiment, an air gap 20 can include a bulbous, rounded or otherwise expanded portion below the lower surface 10 of the substrate 2.

Figure 12:
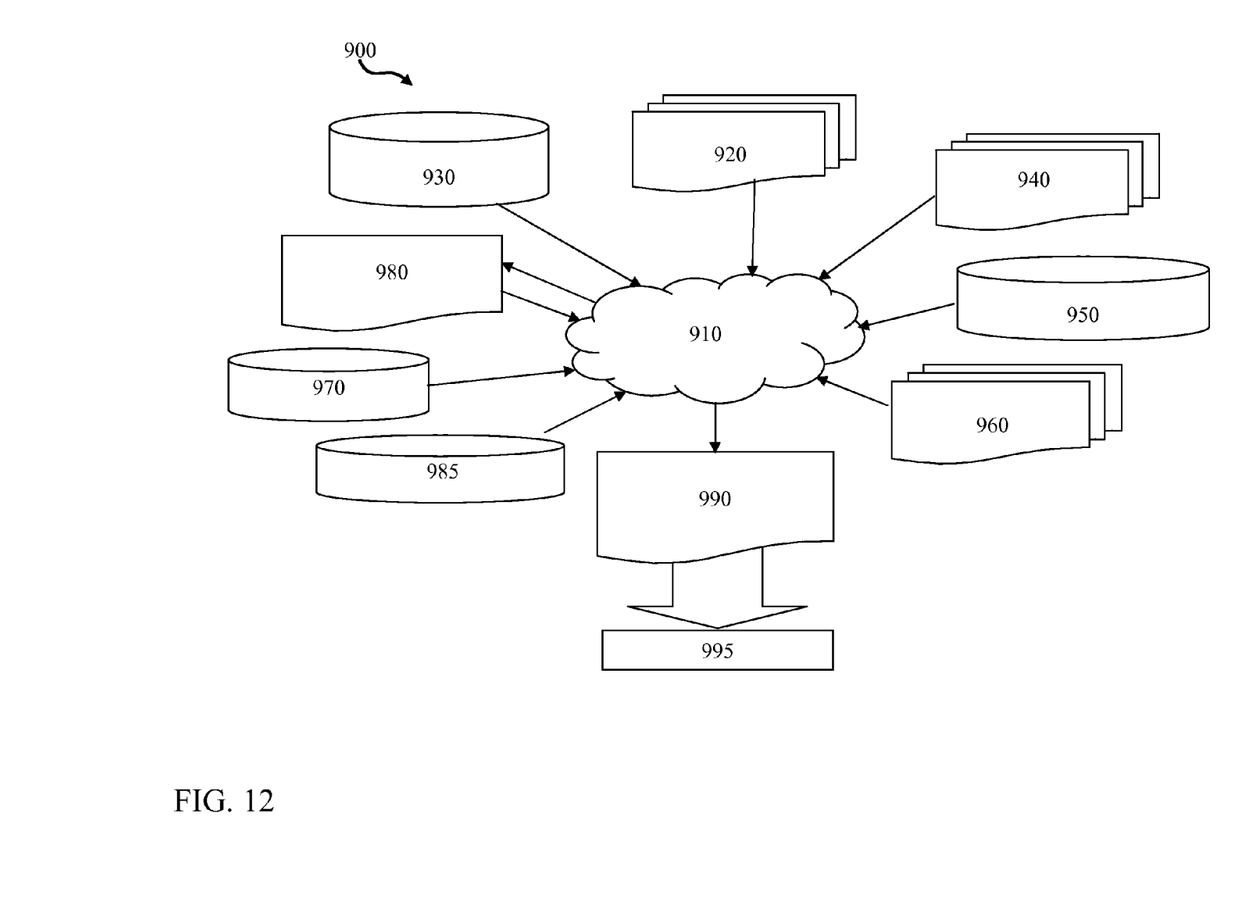
FIG. 12 shows a design flow process according to various embodiments.

FIG. 12 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 5-6 and 11. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA).

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 5-6 and 11. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 5-6 and 11 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 5-6 and 11. In one embodiment, design structure 990 may comprise a compiled, executable HDL simulation model that functionally simulates the devices shown in FIGS. 5-6 and 11.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 5-6 and 11. Design structure 990 may then proceed to a stage 995 where, for example, design structure 990: proceeds to tape-out, is released to manufacturing, is released to a mask house, is sent to another design house, is sent back to the customer, etc.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of forming an integrated circuit structure, the method comprising:
    forming a vent via extending through a shallow trench isolation (STI) and into a substrate;
    selectively removing an exposed portion of the substrate at a bottom of the vent via to form an opening within the substrate, wherein the opening within the substrate abuts at least one of a bottom surface or a sidewall of the STI; and
    sealing the vent via to form an air gap in the opening within the substrate.

2. The method of claim 1, further comprising forming a base region over the vent via after the sealing.

3. The method of claim 1, wherein the sealing of the vent via includes forming a cap layer over the vent via to form the air gap.

4. The method of claim 1, further comprising:
    forming a liner layer along a sidewall of the vent via;
    filling a remaining portion of the vent via with a filler material; and
    selectively removing the filler material, wherein the liner layer remains substantially along the sidewall during the selectively removing.

5. The method of claim 1, wherein the forming of the vent via includes forming an oxide layer over the substrate within an STI trench, and forming the vent via to extend through the oxide layer,
    wherein the sealing including forming a dielectric film over the vent via, and forming a plasma oxide layer over the dielectric film.

6. The method of claim 5, wherein the sealing further includes planarizing the plasma oxide layer after the forming of the plasma oxide layer.

7. The method of claim 1, wherein the liner layer includes an oxide.

8. The method of claim 1, wherein the air gap resides entirely within the substrate.

9. The method of claim 1, wherein the forming of the vent via includes forming the vent via along a portion of a sidewall of the STI.

* * * * *